United States Patent [19]
Konishi et al.

[11] Patent Number: 5,805,493
[45] Date of Patent: Sep. 8, 1998

[54] ASSOCIATIVE MEMORY HAVING A DATA REGISTRATION DEVICE

[75] Inventors: Masahiro Konishi; Hiroshi Sasama, both of Chiba, Japan

[73] Assignee: Kawasaki Steel Corporation, Hyogo, Japan

[21] Appl. No.: 571,771

[22] Filed: Dec. 13, 1995

[30] Foreign Application Priority Data

Dec. 14, 1994 [JP] Japan ................................. 6-310639

[51] Int. Cl.$^6$ .................................................. G11C 15/00
[52] U.S. Cl. ............................................................ 365/49
[58] Field of Search .................................... 365/49

[56] References Cited

U.S. PATENT DOCUMENTS 5,325,501  6/1994  Carlstedt ................................ 365/49
5,465,228  11/1995  Sasama .................................. 365/49

Primary Examiner—David C. Nelms
Assistant Examiner—Hoai Ho
Attorney, Agent, or Firm—Oliff & Berridge, P.L.C.

[57] ABSTRACT

This invention provides an associative memory that includes a plurality of associative memory integrated circuits. Each of the associative memory integrated circuits includes a plurality of memory words and a data registration device. The data registration device stores a retrieval word into one of the plurality of memory words in response to control signal received from an external source if a first priority signal is not received from at least another one of the plurality of associative memory integrated circuits and if the one of the plurality of memory words is in an open state.

18 Claims, 12 Drawing Sheets

ASSOCIATIVE MEMORY HAVING A DATA REGISTRATION DEVICE

BACKGROUND OF THE INVENTION

1. Field of the Invention

The present invention relates to an associative memory (Content Addressable Memory) device and/or the associative memory IC (Integrated Circuit) which are equipped with a plurality of memory words, and a function to retrieve an agreement and non-agreement between the data being stored in each memory word and retrieval data.

2. Background of Related Art

In recent years, an associative memory equipped with the retrieval function has been proposed. In this section, first of all, the structure and the function of the associate memory will be explained, and subsequently, examples of the application of associative memory will be explained.

FIG. 9 is a circuit block diagram showing one example of conventional associative memories.

In this associative memory 10, a plurality of memory words 11a, 11b . . . 11n are provided. Each of the memory words 11a, 11b . . . 11n are composed of a row of plurality of memory cells. In addition, the associative memory is equipped with a retrieval register 12 to which the retrieval data are input and latched. The comparison of agreement and non-agreement between the bit pattern of the total or a designated portion of the retrieval data being latched in the retrieval register 12, and the bit pattern of the corresponding portion of the data being stored in each memory word is accomplished, and an agreement signal of the logic '1' is output to some of the agreement lines 14a, 14b . . . 14n, corresponding to the memory words and the non-agreement signal of the logic '0' is outputted to the other agreement lines 14a, 14c . . . 14n.

In this instance, it is assumed that the signals of '0', '1', '0', '0', '1 '. . . '0' is output to each of the agreement lines 14a, 14b . . . 14n. These signals are input to the priority encoder 15, and an address AD which corresponds to the agreement line with the highest priority among the agreement lines (here 2 lines, namely the agreement lines 14b and 14e) which have the agreement signal of the logic '1' is output from the priority encoder 15. It is assumed here that the earlier the letter of the alphabet, the higher the order of priority. Therefore, agreement line 14b is an agreement line with the highest priority in the above case. The address signal AD corresponding the agreement line with the highest priority is input to the address decoder 16. The address signal AD is decoded at the address decoder 16, and the access signal (the signal of the logic '1' here) is output to one of the word lines (the word line 17b here) corresponding to the input address signal AD. And the data being stored in the memory word 11b corresponding to the word line 17b to which the access signal is output, is read out to the output register 18.

The associative memory 10, as described above, is a memory which can retrieve the data being stored in a plurality of memory words 11a, 11b . . . 11n using the retrieval data, and can read any data stored in the memory words, by obtaining the address of the memory word which is in agreement with the retrieval data.

FIG. 10 is a detailed circuit diagram, showing one memory word in the associative memory.

This memory word 11 is structured with the n pieces of memory cell 11-1, 11-2 . . . 11-n having the identical structure. Each memory cell is equipped with the first invertor 20-1, 20-2 . . . 20-n and the second invertor 21-1, 21-2 . . . 21-n, and the output of the first inverter is connected to the input of the second inverter, and vice versa, therefore one bit data of the logic '1' or the logic '0' can be stored in each of the memory cell.

In addition, in each memory cell, the output of each first invertor is connected to the bit lines 23-1, 23-2 . . . 23-n via N channel transistor 22-1, 22-2 . . . 22n, and the gates of the transistors are connected to the word line 24. Furthermore, the output of each second invertor is connected to the bit bar lines 26-1, 26-2 . . . 26-n via the N channel transistors 25-1, 25-2 . . . 25-n, and the gates of the transistors are also connected to the word line 24. Furthermore, to each memory cell, the two N channel transistors 27-1, 28-1; 27-2, 28-2; . . . 27-n, 28-n are placed being connected in series to connect the bit lines with the bit bar lines, and the gates of the transistors 27-1, 27-2, . . . 27-n are connected to the output of the first invertor 20-1, 20-2, . . . 20-n and the gates of the transistors 28-1, 28-2, . . . 28-n are connected to the output of the second invertor 21-1, 21-2, . . . , 21-n.

In addition, the transistors 36-1, 36-2, . . ., 36-n are placed to the agreement line 14, corresponding to each memory cells 11-1, 11-2, . . . , 11-n, these transistors are connected in series and each gate of these transistors is connected to the central point of two transistors 27-1, 28-1; 27-2, 28-2; . . .; 27-n, 28-n.

In addition, one transistor 36-0 is connected to this agreement line 14, and the agreement line 14 shown at the left edge of FIG. 10 is grounded via this transistor 36-0. Furthermore, the gate of this transistor 36-0 is connected to the control line 30.

The invertor 31 for sensing the agreement line 14 is placed at the right edge of FIG. 10, and the agreement line 14 is further extended from the output of this invertor 31, and is connected to the priority encoder 15 shown in FIG. 9.

In addition, two P channel transistors 32 and 33 are placed between the input of the invertor 31 and the power source $V_{DD}$, the gate of the transistor 32 is connected to the control line 30, and the gate of the transistor 33 is connected to the output of the invertor 31.

With the associative memory being equipped with memory words having the structure described above and its peripheral circuits, agreement retrieval is carried out as follows:

It is assumed that the data of the logic '1' is stored in the memory cell 11-1. Namely in this case, the output of the first invertor 20-1 is in the state of the logic '1' and the output of the second invertor 21-1 is in the state of the logic '0.'

It is assumed that the retrieval of the logic '1' is carried out for the memory cell 11-1. The bit line 23-1 is in the state of the logic '1' and the bit bar line 26-1 is in the state of the logic '0.' The word line 24 is maintained in the state of the logic '0.' In this case, the voltage of the logic '1' is added to the gate of the transistor 27-1, the signal of the logic '1' of the bit line 23-1 is added to the gate of the transistor 36-1, and the state of the transistor 36-1 becomes the ON state. In other words, when the bit data stored in the memory cell 11-1 agree with the bit data of the retrieval data input via the bit line 23-1 and the bit bar line 26-1, the state of transistor 36-1 becomes the ON state.

In addition, it is assumed that the data of the logic '0' is stored in the memory cell 11-2. In this case, the output of the first invertor 20-2 becomes the logic '0' and the output of the second invertor 21-2 becomes the logic '1.'

It is assumed that the retrieval of the logic '1' is carried out for this memory cell 11-2. The bit line 23-2 is the logic '1' and the bit bar line 26-2 is the logic '0.' In this case, the signal from the bit bar 26-2 being in the state of the logic '0' via the transistor 28-2, is added to the gate of the transistor 36-2, therefore, this transistor 36-2 stays in the OFF state. In other words, in the case of disagreement, the electric charge which is precharged beforehand to the agreement line 14 cannot be charged.

In addition, in regard to the bit covered with a mask, as shown in the memory cell 11-n, both of the bit line 23-n and the bit bar line 26-n are converted to the logic '1.' In this case, the state of the transistor 27-n or the transistor 28-n becomes ON, in accordance with the fact that the data of the logic '1' is stored in the memory cell 11-n, or the data of the logic '0' is stored in the memory cell 11-n. By doing the above, in either case, the state of the transistor 36-n becomes ON. In other words, the bit data being stored in the memory cell and the retrieval bit data are in agreement, relative to the memory cell.

At retrieval, the control line 30 becomes the logic '0' first, the state of the transistor 32 becomes ON, the agreement line 14 of the input side of the invertor 31 is precharged and becomes the logic '1,' and the state of the transistor 33 becomes ON by the inverted output of the invertor 31. Subsequently, the control line 30 becomes the logic '1,' the state of the transistor 32 becomes OFF, and the state of the transistor 36-0 becomes ON.

At this time, in the case that all memory cells, structuring this memory word 11 by the data being stored in the memory cells and the retrieval data being input, are in agreement (as described above, it is assumed that the bits covered with mask are in agreement), the state of all transistors 36-1, 36-2, ..., 36-n are ON, the electric charge being precharged to the agreement line 14 is discharged, and the signal of the logic '1' is output from the invertor 31.

In addition, the memory structure of the associative memory shown in FIG. 10 is merely one example, and there are various types of structures being proposed.

Subsequently, an example of its application to a LAN (Local area network) will be explained.

FIG. 11 is a diagram showing one example of a LAN.

As shown in FIG. 11(A), a plural number of terminals A to G and T to Z are connected each other to the two communication lines LAN 1 and LAN 2, and two communication networks are structured. It is assumed that the amount of traffic of the communication line LAN 1 and LAN 2 (the degree of congestion of this communication line) is 10 each.

In the case when these two communication lines are to be connected to each other, as shown in FIG. 11(B), if they are connected in a simple manner, the amount of traffic of the communication line LAN 1 and LAN 2 becomes 20, extremely congested, and each terminal cannot be connected easily, and as a result, the waiting time and the waste time will be increased.

Therefore, normally, as shown in FIG. 11(C), a bridge, which carries out the filtering function whether the data being sent from one side of these communication lines LAN 1 and LAN 2 is to be transmitted to the other, is connected in the middle section of LAN 1 and LAN 2. In the case that this bridge is connected, the amount of traffic of the data passing through the bridge is greatly reduced, in other words, if it is assumed that the amount of traffic of the data sent and received between the two networks is considered as 1, and the amount of traffic is 10 in the inner section of LAN 1 or LAN 2 are added, each of the amounts of traffic of LAN 1 and LAN 2 become 11 for each, and the amount of traffic is greatly reduced in comparison with that of FIG. 11(B). The connection of the two communication circuits LAN 1 and LAN 2 is explained here. If more than two communication circuits are connected to one bridge, an even greater traffic difference is apparent.

FIG. 12 is an explanatory diagram of the bridge function.

The bridge contains a memory in the internal section and initially all are in a blank state. For example, when the data is sent out from terminal A of LAN 1 and after receiving the data sent from the LAN 1 side, the bridge determines whether or not terminal A is connected to LAN 1. This determination is theoretically carried out by having in the Internal memory of the bridge table 1 and table 2 corresponding to LAN 1 and LAN 2, respectively. Since table 1 is blank, terminal A is written into table 1 corresponding to LAN 1. Initially, the determination is made concerning only the terminal A. At this time, it is not clear whether or not the receiver of the data being sent from terminal A, is in LAN 1 side which is the same side as terminal A. Therefore, the data is passed through the bridge unconditionally.

By repeating the determination process of this kind, the table 1 and table 2 are made. After these tables are made, for example, as shown in FIG. 12, data sent from terminal B (LAN 1 side) to terminal X (LAN 2 side) are passed through the bridge because the bridge recognizes that terminal B and terminal X are on different LANs. In the case that both the sender and the receiver are terminal A and terminal E of the LAN 1 SIDE, the data is not passed through the bridge, because the bridge recognizes that terminal A and terminal E are in the communication network of the same side of the bridge. Therefore, as described previously, the amount of traffic can be reduced.

When the associative memory is used as the memory equipped in the bridge, the processes can be carried out with high speed. For example, the data of each of the terminals A to G and T to Z belonging to the table 1 (being connected to the LAN 1 side) or to the table 2 (being connected to the LAN 2 side) are stored in the associative memory. The associate memory is used when the judgement is made whether the data are to be passed. For example, in the case that the receiver is terminal X, terminal X is retrieved as the retrieval data and terminal X is recognized as the terminal belonging to the table 2 (LAN 2). Then, it is possible to determine whether or not the data based on the above are to be passed.

On the other hand, in the case that the conventional random access memory (RAM) is provided to the bridge, the data being stored in the memory are read one by one, and it is necessary to sequentially retrieve and determine by comparison whether or not the data is the data from terminal X. As a result, it requires a large amount of time in order to determine whether or not the data is to be passed through the bridge.

As described above, the associative memory can be used most suitably for LAN networks and the like. However, when the data is sent out from terminal A, the bridge which receives the data need to verify whether terminal A is registered in the memory of the bridge. If terminal A is not yet registered, it is necessary to register terminal A. Conventionally, it has been necessary to perform this registration in two steps: it is necessary to confirm whether terminal A is registered and then to register terminal A if terminal A is not yet registered. This fact has become one of the baffles at the time when the operation of the bridge is further accelerated.

With the object of overcoming the above, an associative memory which can carry out the speedy registration of a data not yet registered, is described in Japanese Patent Application Hei 5-248120 (1993) filed by this applicant. This is U.S. Pat. No. 5,465,228 issued on Nov. 7,1995. On the other hand it has been considered that several pieces of the associative memories of an identical structure are connected in cascade to increase the memory volume.

However, when the associative memory proposed as described above, the technology carrying out the speedy registration of data not yet registered as described above is applied to several pieces of the associative memories of an identical structure, which are pre-structured so that they operate as one associative memory, the data not registered are registered in duplicate to the plurality of associative memories which are connected in cascade. Even if the memories are connected in cascade, it is not possible to actually increase the memory volume. This is a point at issue.

SUMMARY OF THE INVENTION

In view of the situation described above, the purpose of the present invention is to provide an associative memory IC which can constitute an associative memory having large memory volume by cascade connection. Another purpose of the present invention is to provide an associative memory, in which the registration of non-registered data can be carried out at high speed.

The associative memory IC according to the present invention is equipped with a plurality of memory words in which each stored data can be re-written freely, and which carries out the retrieval of the memory words storing the desired data using the input data when the data for retrieval is input. The plurality of associative memory ICs are connected to each other to a common data input bus with a cascade connection. The data is input through the data input bus to each of the plurality of associative memory ICs, and retrieval is carried out with the input data. The associative memory IC is equipped with a data registration device for registering the data used for retrieval in one memory word among empty memory words in which effective data are not stored and can be overwritten in one associative memory IC among associative memory ICs having empty words.

Here, "the data used for retrieval" which is the object of the data registration, can be "the data for retrieval" itself which is input from the outside, however, it is not limited to this, and it is appropriate that a mask can be placed on the data for retrieval or it can be the data altered by adding any bits.

Furthermore, it is not always necessary to register the data being used for retrieval at the time of retrieval for the data registration device described above. It is also appropriate to add a circuit which determines whether the data is to be registered.

In the associative memory according to the present invention explained above, with the data registration device, the actual structure can be in any form, however, as the first preferable example, the data registration device for a chip comprises the following:

(1-1) Open flag registers for storing the states which displays that the corresponding memory words is in the open state or not. Of the open flag registers each corresponds to a memory word, (1-2) a data registration state detection circuit for detecting whether there are at least one of a plurality of open flag registers corresponding to a plurality of memory words, (1-3) a retrieval data writing circuit for writing the data being used for retrieval, in one of the plurality of memory words whose corresponding open flag register stores the open flag, (1-4) a data registration control signal input terminal, which inputs the data registration control signal indicating the data registration, (1-5) a priority signal input terminal, which inputs the first priority signal indicating that the said open state is stored to the one open flag at least, all of the associative memory being connected to the front step side among the plurality of associative memory ICs, (1-6) a priority signal output terminal, which outputs the second priority signal indicating that at least one of the two occurrences has been taken place, namely one of the following: the first priority signal has been input from the priority signal input terminal and the state to be able to register the data is detected at the detection circuit to detect the state of possible registration, and (1-7) a flag reset circuit, in which, in the case when the input from the data registration control signal is received, there is no input of the first priority signal, and the chip itself is in the state of possible data registration, and an open flag register, corresponding to the memory word in which the data being used for retrieval are written, is reset in the state indicating the effective stored data are stored in the memory.

In addition, the data registration means can be further structured by being equipped with the following:

(1-8) The data registration device described above is equipped with a mishit signal input terminal to which the first mishit signal is input, indicating that the memory word does not exist in which the designated stored data are stored in memory, in any of all of the associative memories being connected to the front step side among the plural number of associative memories, and (1-9) a mishit signal output terminal from which the second mishit signal is output, indicating that the memory word does not exist in which the designated stored data are stored in memory, in any of all of the associative memories connected to the front step side among the plural number of associative memories.

In addition, as the second example of the data registration device for a chip in the associative memory according to the present invention described above can be structured by being equipped as in the following:

(2-1) An open flag register for storing the state which indicates that the corresponding memory word is in the open state or not, is placed each corresponding memory word, (2-2) a data registrable state detection circuit for detecting whether or not there are at least one of a plurality of open flag registers corresponding to a plurality of memory words, (2-3) a retrieval data writing circuit, for writing the data being used for retrieval, in one memory word whose corresponding open flag register stores the open state, (2-4) a data registration indication flag register, which rewrites and stores the data registration indication flag, indicating the data registration, (2-5) a priority signal input terminal, which inputs the first priority signal indicating that the said open state is stored to the one open flag at least, throughout the associative memory being connected to the front step side among the plurality of associative memory ICs, (2-6) a priority signal output terminal, which outputs the second priority signal indicating that at least one of the two occurrences has taken place, namely one of the following: the first priority signal has been input from the priority signal input terminal and the state to be able to register the data is detected at the detection circuit to detect the state of possible registration, and (2-7) a flag reset circuit, in which, in the case that the registration indication flag is stored in the registration indication flag register, there is no input of the first priority signal, and furthermore the chip itself is in the state of possible data registration, and an open flag register, corresponding to the memory word in which the data being used for retrieval are written, is reset in the state indicating the effective stored data are stored in the memory.

The associative memory according to the present invention described above, is equipped with a data registration device in which at the time of retrieval, the data being used for retrieval are stored to the some of the memory words in some of the associative memories, therefore, the retrieval operation and writing operation can be carried out simultaneously. It is possible to carry out the process with high speed.

In this instance, in the case that the structure of the data registration means is equipped with the structures described in (1-1) to (1-7), it is possible to determine whether the data registration is to be carried out at the time of retrieval, in accordance with the determination whether or not the data registration control signal from the data registration control signal input terminal described in (1-4) is to be input.

In the case that the structures described in (1-8) and (1-9) are further added to the data registration device being equipped with the structures described in (1-1) through (1-7), data storage can be carried out, when it is so structured that, at the time of retrieval, the data registration control signal is input from the data registration control signal input terminal in the structure described in (1-4), receiving the information that the second mishit signal has been output from the mishit signal output terminal in the structure described in (1-9), and in the case that the memory words in which the designated stored data are not detected, in all of the plurality of associative memories being connected in cascade.

In addition, in the case that the structures described in (1-8) and (1-9) are equipped for purposes other than data registration, these structures can be utilized also for data registration.

In addition, in the case that the data registration means is equipped with the structures described in (2-1) to (2-7), it is possible to determine whether data registration is to be carried out at the time of retrieval, in accordance with the determination as to whether the data registration indication flag is to be stored to the data registration indication flag register of the structure described in (2-4).

BRIEF DESCRIPTION OF THE DRAWINGS

The invention will be described in detail with reference to the following drawings, wherein like numerals represent like elements and.

DETAILED DESCRIPTION OF THE PREFERRED EMBODIMENT

Embodiments according to the present invention are explained hereafter.

Figure 1:
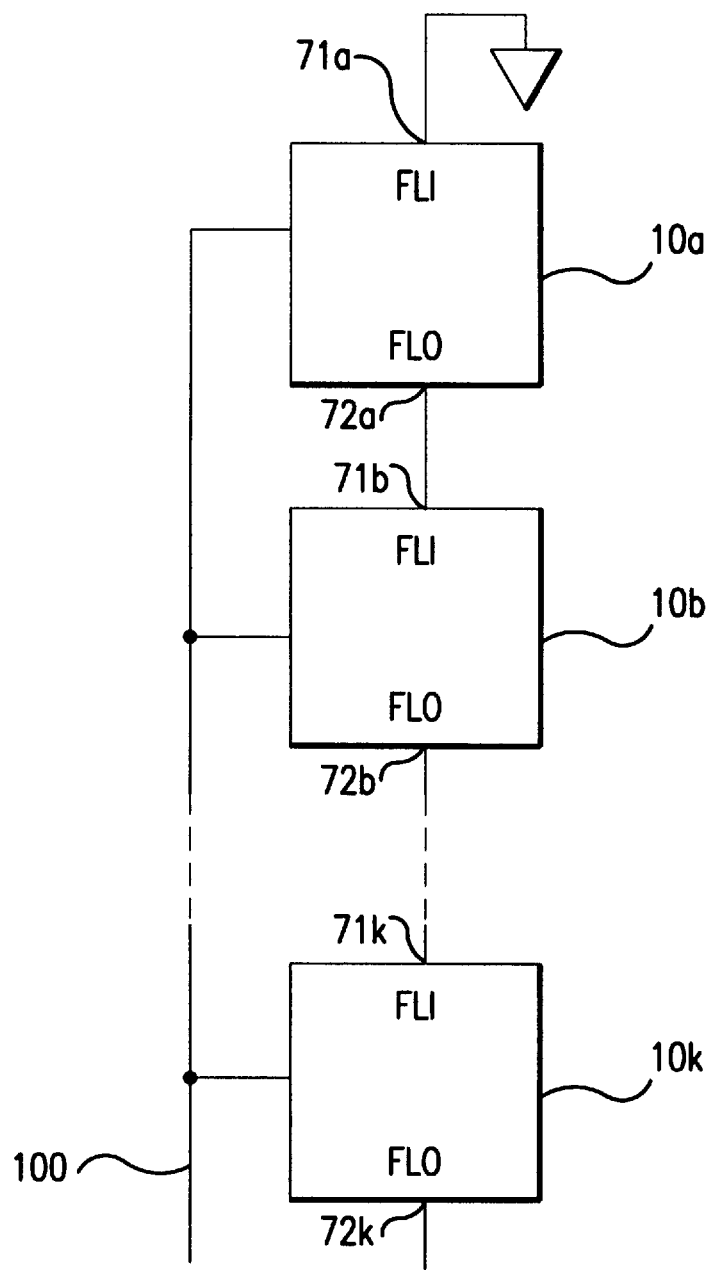
FIG. 1 is a schematic drawing of a plurality of associative memory ICs connected in cascade.

FIG. 1 shows a plurality of associative memories connected in cascade. In order to make it simple, herein after, each associative memory is called a "chip."

Each chip $10a$, $10b$, . . ., $10k$ is equipped with priority signal input terminals $71a$, $71b$, . . ., $71k$ to which the first priority signal FLI is input, and with the priority signal output terminals $72a$, $72b$, . . ., $72k$ from which the second priority signal FLO is output. The priority signal output terminals $72a$, $72b$, . . ., of the chips $10a$, $10b$, . . . in the front step side (upper side in the FIG. 1) are connected with the priority signal input terminals $71b$, . . ., $71k$ of the chips $10b$, . . . , $10k$ being joined to the back step side (lower side in the FIG. 1). In addition, the priority signal input terminal $71a$ of the chip $10a$ placed to the front-most step (upper most step in the FIG. 1) is grounded.

The first priority signal FLI represents that a priority right exists to register the data being used for retrieval at the time of retrieval to the chip in the front step side, and the second priority signal FLO represents that the priority right of data registration exists to the chip in the front step side or to itself.

In addition, a common signal line 100 is connected to the plurality of chips $10a$, $10b$, . . ., $10k$ being connected to each other in cascade, as shown in FIG. 1. Only one of the common signal line 100 is shown as a representative, in the FIG. 1, however, as shown in FIG. 2, a plurality of signal lines such as an input data bus, a retrieval control signal, data registration control signal, data writing control signal and the like are connected in common to the plurality of chips $10a$, $10b$, . . ., $10k$.

Figure 2:
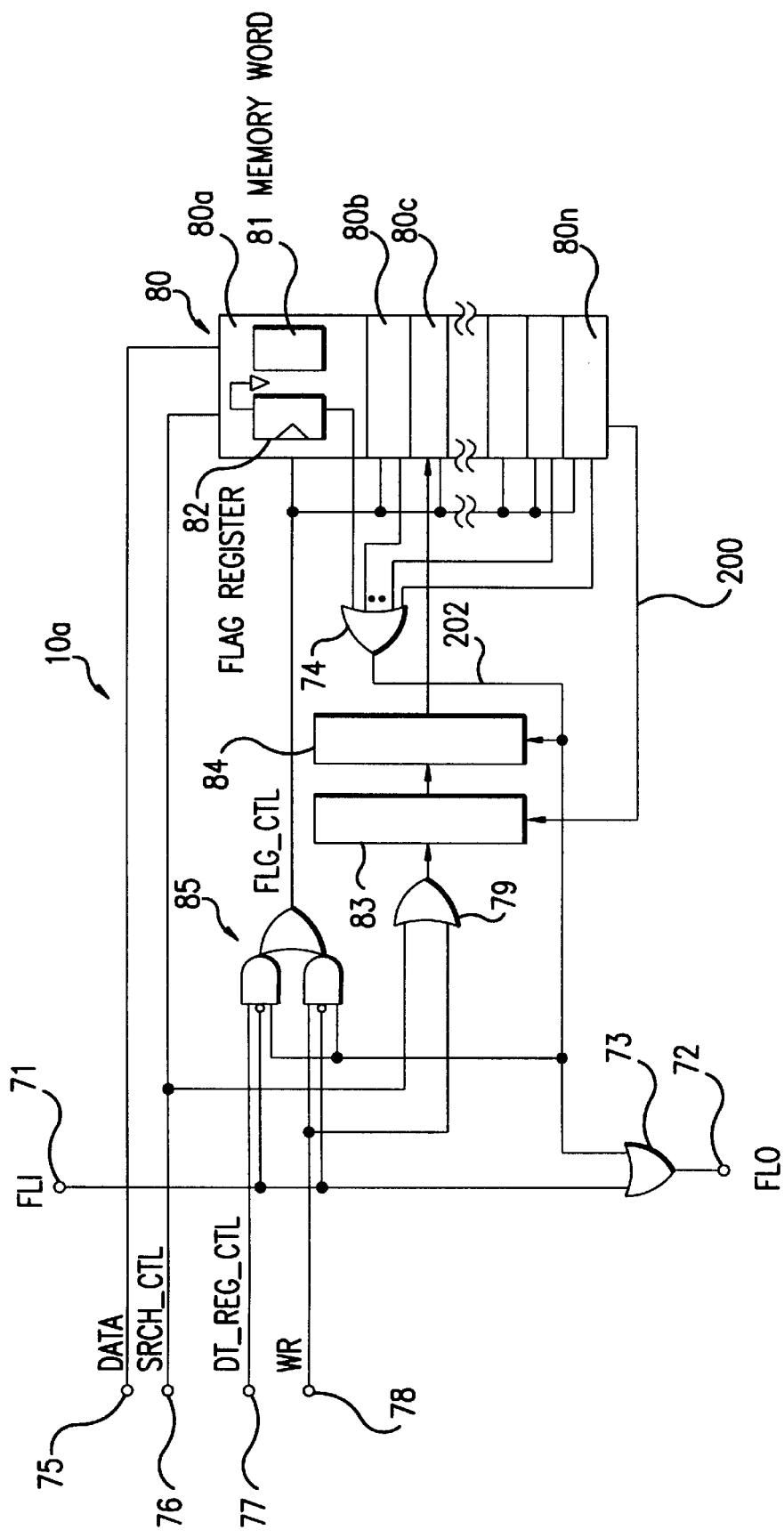
FIG. 2 is an internal structural drawing of one of the plurality of associative memories shown in FIG. 1.

FIG. 2 is one of the internal structural drawings of the plurality of associative memories (chips) being connected in cascade shown in FIG. 1. Only the necessary elements for data writing are shown here, and the structure concerning the data reading is omitted since the structure is not related directly to the present invention.

The first priority signal FLI is input from a priority signal input terminal 71 of the chip $10a$ shown in FIG. 2. The first priority signal FLI is at the "H" level, when the priority right of the data registration, at the time of retrieval, exists in either of the chips in the front step side rather than the chip $10a$, the effective retrieval data are registered to all of the memory words of all chips in the front step side, and the first priority signal FLI is converted to the "L" level at the time when the memory words in the open state no longer exist (the memory words are in a registered state). In the case that it is itself at the front-most step, the chip where a higher priority degree does not exist, therefore, the priority signal input terminal 71 is so grounded that the signals of the "L" level can be input at all times.

In the case that the first priority signal FLI is the "L" level, the signal of "H" level is transmitted to the chip located at the back step side as the second priority signal FLO via the OR gate 73.

In addition, the memory section 80 of the chip 10A is equipped with a plurality of memory areas (80a, 80b, . . . 80n). Each memory area comprises the memory word 81 for storing data in the quantity of 1 word, and an open flag register 82 for indicating the open state (logic "1") and the registered state (logic "0") of corresponding memory word. The open flag of logic "1" is stored in the open flag register 82 at the initial stage. In addition, in FIG. 2, in order to avoid complexity in the drawing, only the memory section 80a of the memory word 81 and the open flag register 82, is shown in the drawing.

The outputs from all of the open flag registers 82 in all memory areas are input to the OR gate 74, and the output from the OR gate 74 is input to the OR gate 73. Therefore, in the case that the open flag "1" is stored in one of open flag registers, even if the first priority signal FLI is not the "H" level from the priority signal input terminal 71, the second priority signal FLO of the "H" level is output from the priority signal output terminal 72.

The data writing control signal WR indicating the data writing is input.

In addition, the plurality of chips are connected in cascade through signal input terminals that are in common to the plurality of chips. The chip 10a includes the data input bus connected to a data input terminal 75. The signal DATA is transmitted through the data input bus. A retrieval control signal SRCH-CTL indicating the retrieval operation is input through a retrieval control signal input terminal 76. A data registration control signal DT-REG-CTL indicating the data registration at the time of retrieval is input through a data registration control signal input terminal 77. A data writing control signal WR indicating the data writing is input through a data writing control signal input terminal 78.

Figure 3:
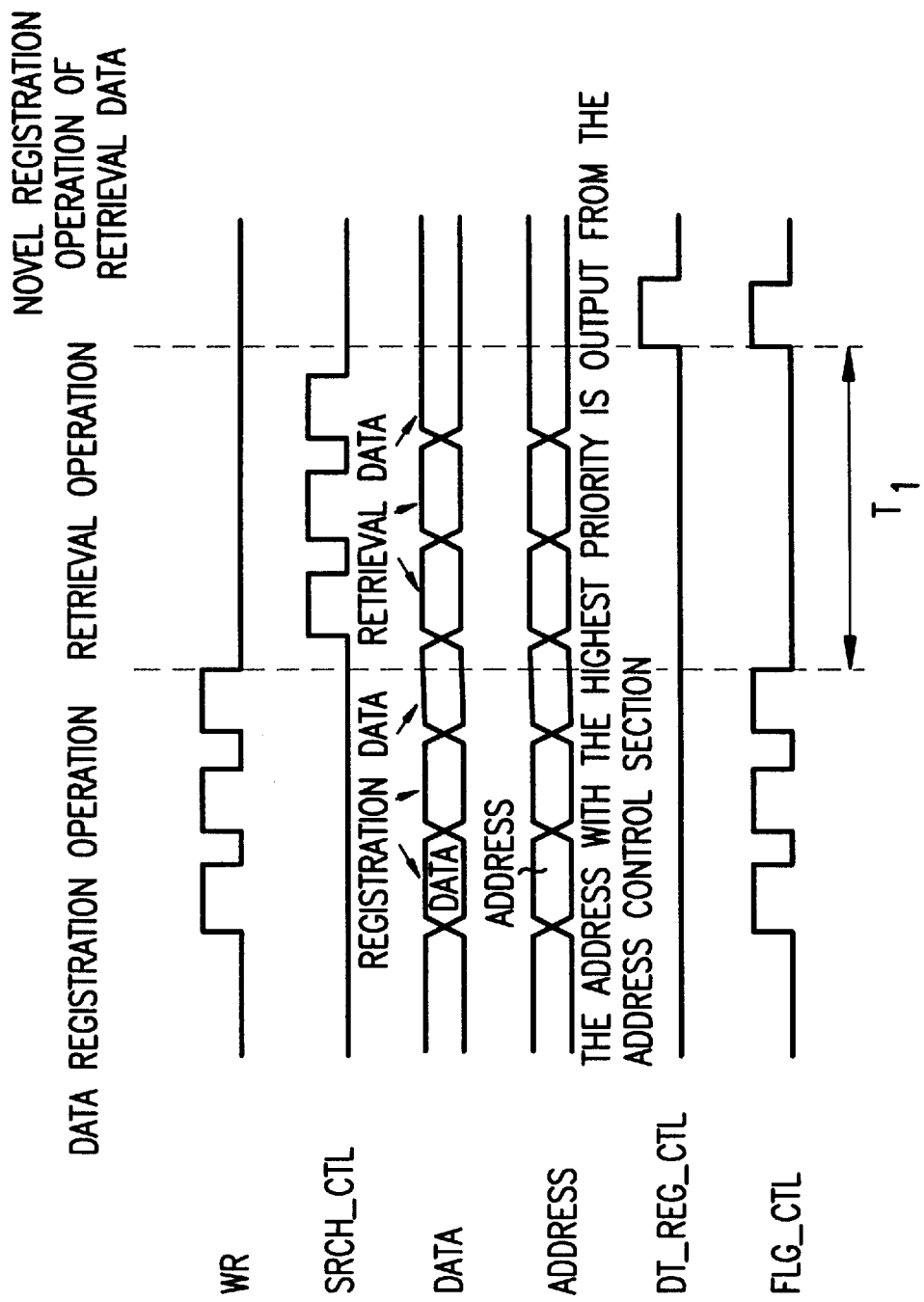
FIG. 3 is a timing chart of the associative memory shown in FIG. 2.

FIG. 3 is a timing chart of the chip 10a shown in FIG. 2. An explanation of the chip 10a shown in FIG. 2 will be continued in the following, referring to the FIG. 2 and the FIG. 3.

When the signal DATA is input from the data input terminal 75, and the data writing control signal WR is the "H" level input to the data writing control signal input terminal 78, the data writing control signal WR is input to an address control section 83 via the OR gate 79. The data on signal line 200, indicating that all of the memory areas are in the open state, is input from the memory section 80. At the address control section 83, a signal ADDRESS is created and output, corresponding to the memory area with the nearest address among the memory areas in the open state. The signal ADDRESS is input to a decoder section 84, the word line in the memory area of the signal ADDRESS is activated, and the signal DATA being input from the data input terminal 75 are stored in the word memory 81 of the memory area.

In addition, information is transmitted on signal line 202 to the decoder section 84 from the memory section 80, concerning whether at least one of the all memory areas in the memory section 80 is in the open state or none is in the open state. When no open state exists, for example, even if transient and pseudo data are input from the address control section 83, it is so controlled at the decoder section 84 that none of the word lines in any of the memory areas will be activated.

The data writing control signal WR is also input to the gate circuit 85. When the first priority signal FLI from the priority signal input terminal 71 is the "L" level, and at least one of the memory areas of the memory section 80 is in the open state, the output from the OR gate 74 is the "H" level and the "H" level of the data writing control signal WR is passed through setting a flag control signal FLG-CTL to the "H" level. The flag control signal FLG-CTL is input to the memory section 80 and a logic "0" is stored in the open flag register 82 corresponding to memory area where the data being input from the data input terminal 75 are stored in the memory. The logic "0", indicating that the effective stored data are stored. In addition, when there is a memory area in the open state which exists in the chip 10a, the signal DATA is stored in the memory word of the memory area in the open state corresponding to the signal ADDRESS being created at the address control section 83.

However, when the first priority signal FLI is the "H" level indicating that the priority right of the data storage exists in the front step side viewing from the chip 10a, the flag control signal FLG-CTL is the "L" level output from the gate circuit 85. The open flag register in that memory area stays at the logic "1" which is the state in which the open flag is stored. Therefore, the memory area stays in the open state continuously.

In addition, when the memory area of the open state does not exist in the memory section 80 of the chip 10a, the word line corresponding to any of the memory areas is not activated. Therefore, the signal DATA is not stored in any of the memory words of the memory areas and the flag control signal FLG-CTL is the "L" level output from the gate circuit 85.

With the timing chart shown in FIG. 3, the priority rights of the data registration exists within the chip 10a. Timing is indicated for when the signal DATA is input and stored in the memory for 3 times continuously.

When retrieval is carried out, the data for retrieval is input from the data input terminal 75. The retrieval control signal SRCH-CTL is input from the retrieval control signal input terminal 76. Subsequently, data in agreement with the signal DATA being input is retrieved from the memory section 80.

In addition, the retrieval control signal SRCH-CTL, in the same manner as in the data writing control signal described above, is input to the address control section 83 also via the OR gate 79. In other words, the retrieval is carried out using the signal DATA for retrieval, and at the same time, the signal DATA for retrieval is stored in the memory words in the memory area being in the open state.

Subsequently, when the data registration control signal DT-REG-CTL is the "H" level input from the data registration control signal input terminal 77, the data registration control signal DT-REG-CTL, as in the same manner seen in the data writing control signal WR described above, is output as the flag control signal FLG-CTL via the gate circuit 85. When the priority right of the data registration exists in the chip 10a, the "H" level of the FLG-CTL is input to the memory section 80. The open flag register 82, corresponding to the memory areas containing the memory word 81 in which the retrieval data is stored in the memory, is reset to the logic "0" state indicating that the effective retrieval data are stored in the memory.

When the priority right of the data registration does not exist in chip 10a, the flag control signal FLG-CTL is the "L"

level from the gate circuit 85. Even if the retrieval data is stored in the memory word when the memory word is in the open state, the open flag register corresponding to the above memory word is kept in the logic "1" state that the open flag is stored continuously, and the following retrieval data also will be over-written in the memory word.

The priority for data registration may be determined till the time for data registration, namely $T_1$ in FIG. 3, which is determined by DT-REG-CTL input. Therefore, after the data registration is accomplished, in no time, the retrieval can be started.

Figure 4:
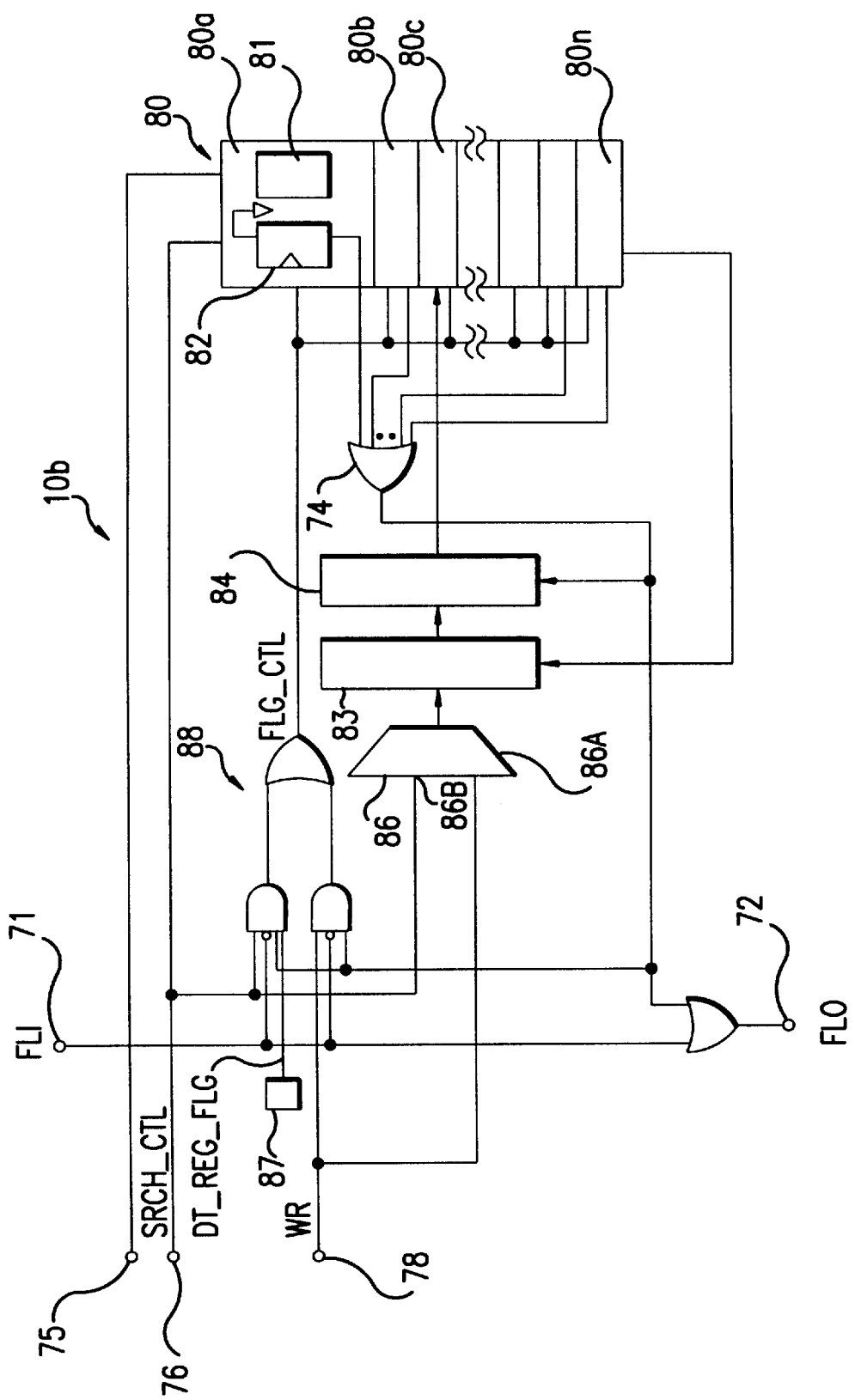
FIG. 4 is an internal structural drawing of one of the embodiments of the associative memory shown in FIG. 1.
Figure 5:
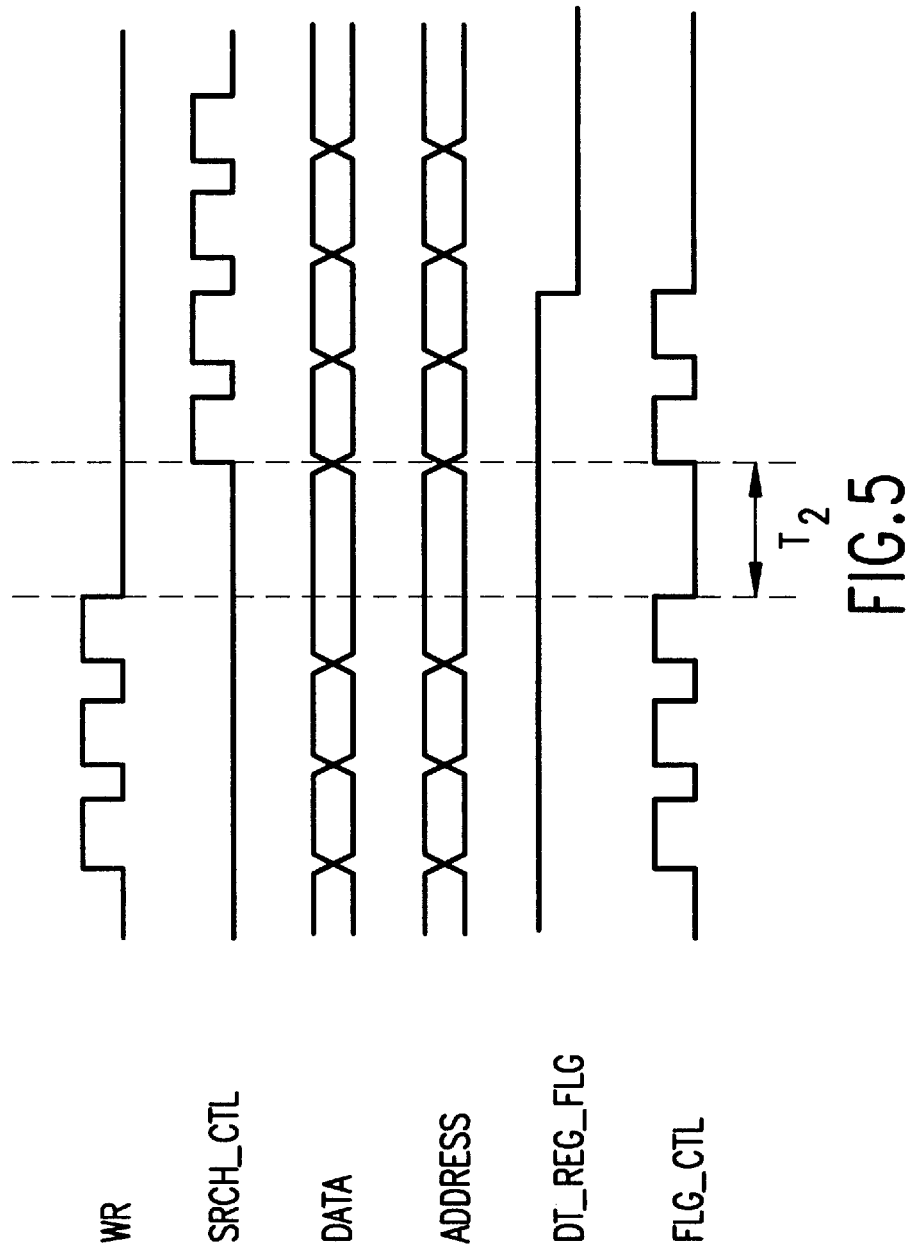
FIG. 5 is a timing chart of the associative memory shown in FIG. 4.

FIG. 4 is an internal structural drawing of one of the embodiments of the associative memory connected in cascade. FIG. 5 is a timing chart corresponding to FIG. 4. The numerals of FIG. 2 and FIG. 3 are referring to identical elements in FIG. 4 and FIG. 5. Only the differences between FIGS. 2 and 3 and FIGS. 4 and 5 will be explained.

The associative memory 10b shown in FIG. 4, is equipped with a registration indication flag register 87 in which the data registration indication flag is stored with free re-write indicating the data registration at the time of retrieval. The registration indication flag register 87 replaces the data registration control signal input terminal 77 of FIG. 2. A gate circuit 88 corresponds to the gate circuit 85 shown in FIG. 2 and the selector 86 corresponds to the OR gate 79 shown in FIG. 2. The selector 86 selects the input 86A at the time of data writing, and this is switched to select the 86B at the time of retrieval.

In FIG. 5, the data registration indication flag is a logic "1" and stored in the registration indication flag register 87, up to the time of second retrieval.

The selector 86 selects the input 86A at the time of data writing, and the writing is carried out, in the same manner as in the embodiment shown in FIG. 2. The priority right exists in chip 10b in the timing chart shown in FIG. 5. The sequence carries out the writing of the retrieval data for 3 continuous times.

On the other hand, at the time of retrieval, the selector 86 is switched over to select the input 86B. When the data registration indication flag DT-REG-FLG is a logic "1" and is stored in the registration indication flag register 87, and if the priority right exists in the chip 10b, the retrieval data is registered automatically to the memory word in retrieval and the open flag register 82 is reset to logic "0" at the same time without inputting the data registration control signal DT-REG-CTL from the external section as in the embodiment shown in FIG. 2.

In the embodiment shown in FIG. 4, as described above, if the data registration indication flag DT-REG-FLG is stored in the registration indication flag register 87 during retrieval, the FLG-CTL signal is the "H" level for the chips having the priority right of data registration among the chips being connected in the cascade connection. The retrieval data of the chips having FLG-CTL at the "H" level is automatically stored in the memory. Therefore, it is advantageous to register the signal DATA when the signal DATA is input sequentially via the data input bus.

However, in the embodiment shown in FIG. 4, the data is automatically stored in the memory at the same time as the time of retrieval. Therefore, it is necessary for the priority right to be established by the data registration before retrieval is started. Thus, it is necessary to start the retrieval after waiting for the time $T_2$ shown in FIG. 5.

Figure 6:
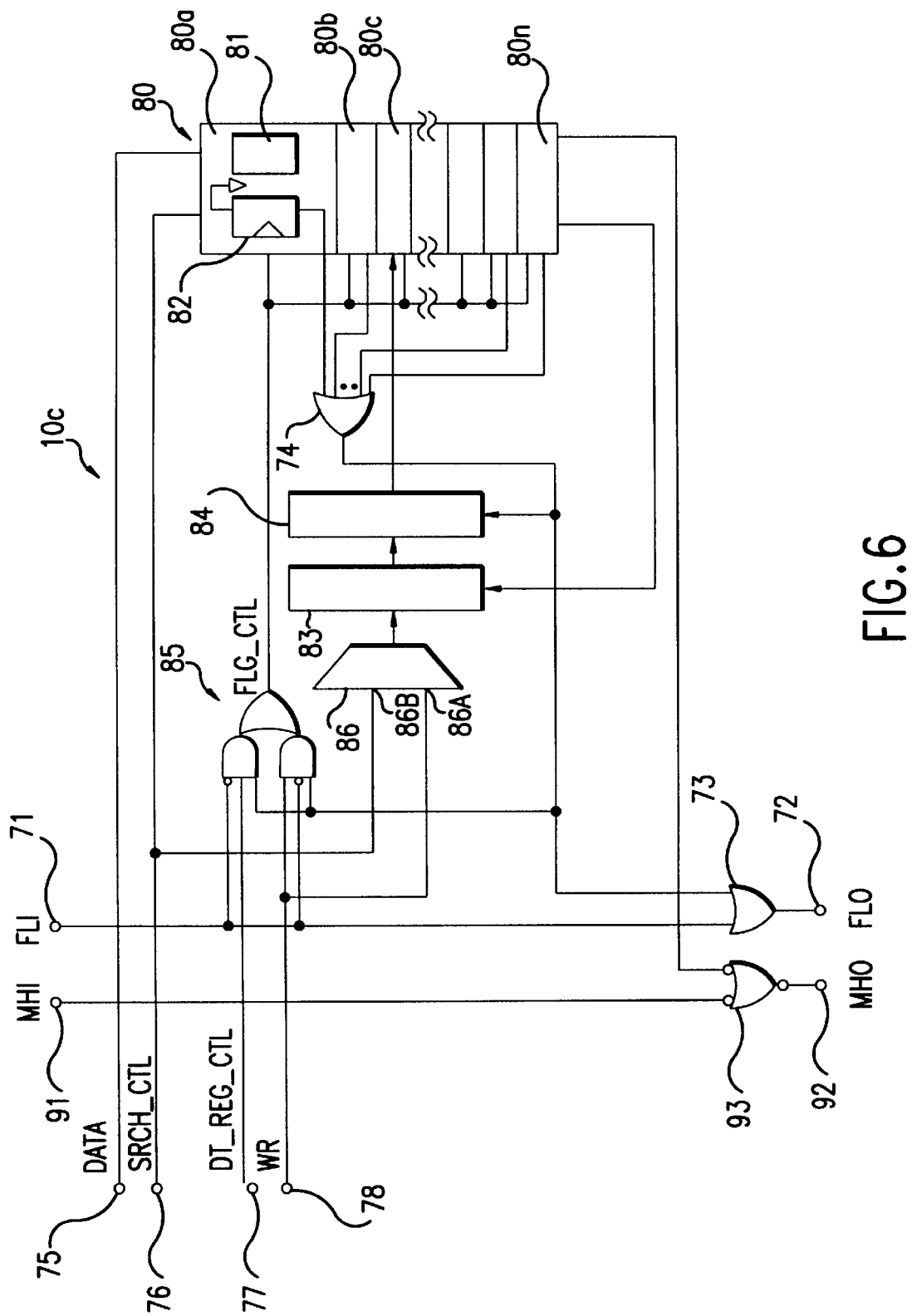
FIG. 6 is an internal structural drawing one of the embodiments of the associative memories connected in cascade.
Figure 7:
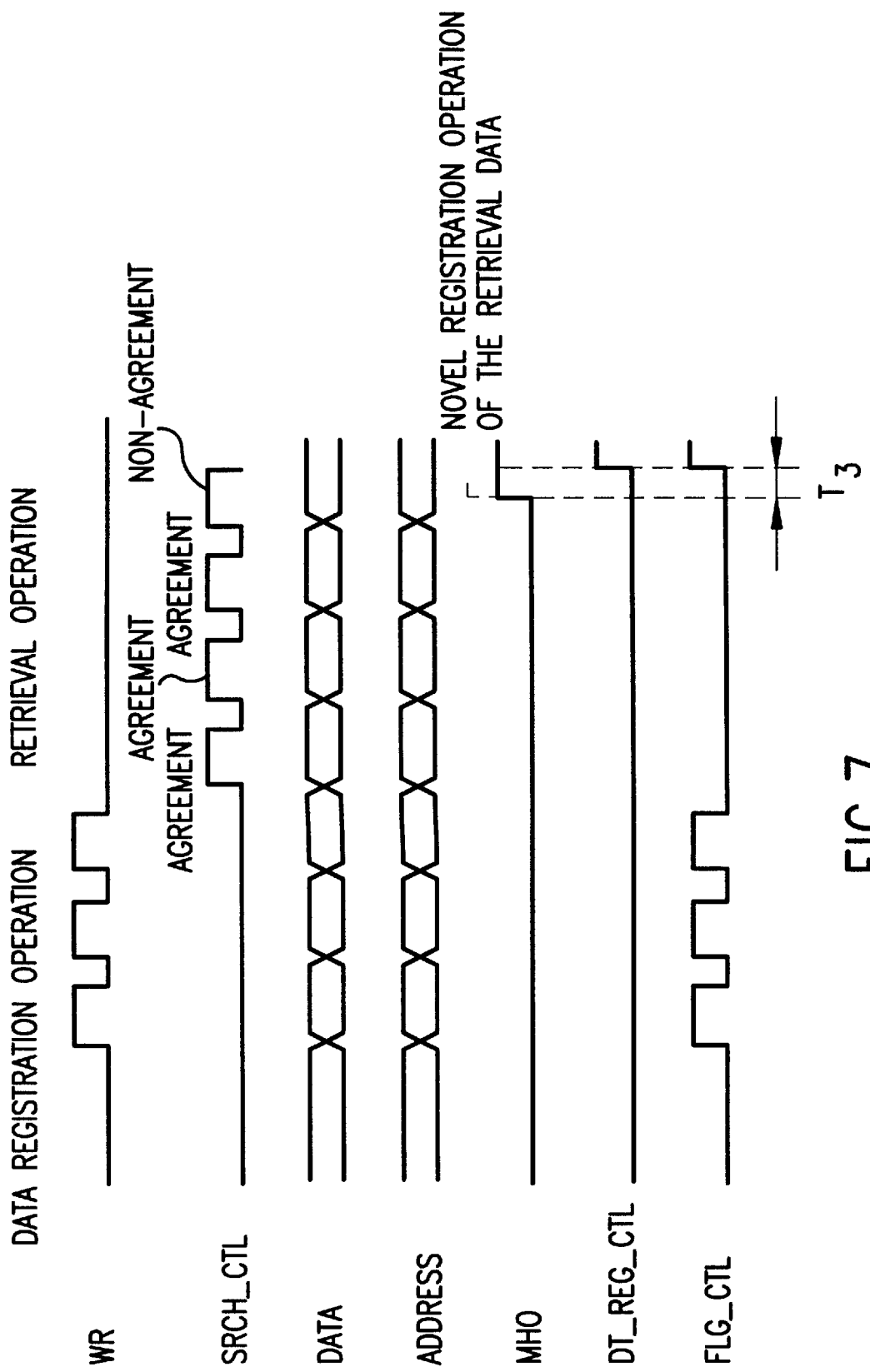
FIG. 7 is a timing chart of the associative memory shown in FIG. 6.

FIG. 6 is an internal structural drawing showing another embodiment of the associative memory being connected in cascade. FIG. 7 is a timing chart corresponding to FIG. 6.

Figure 8:
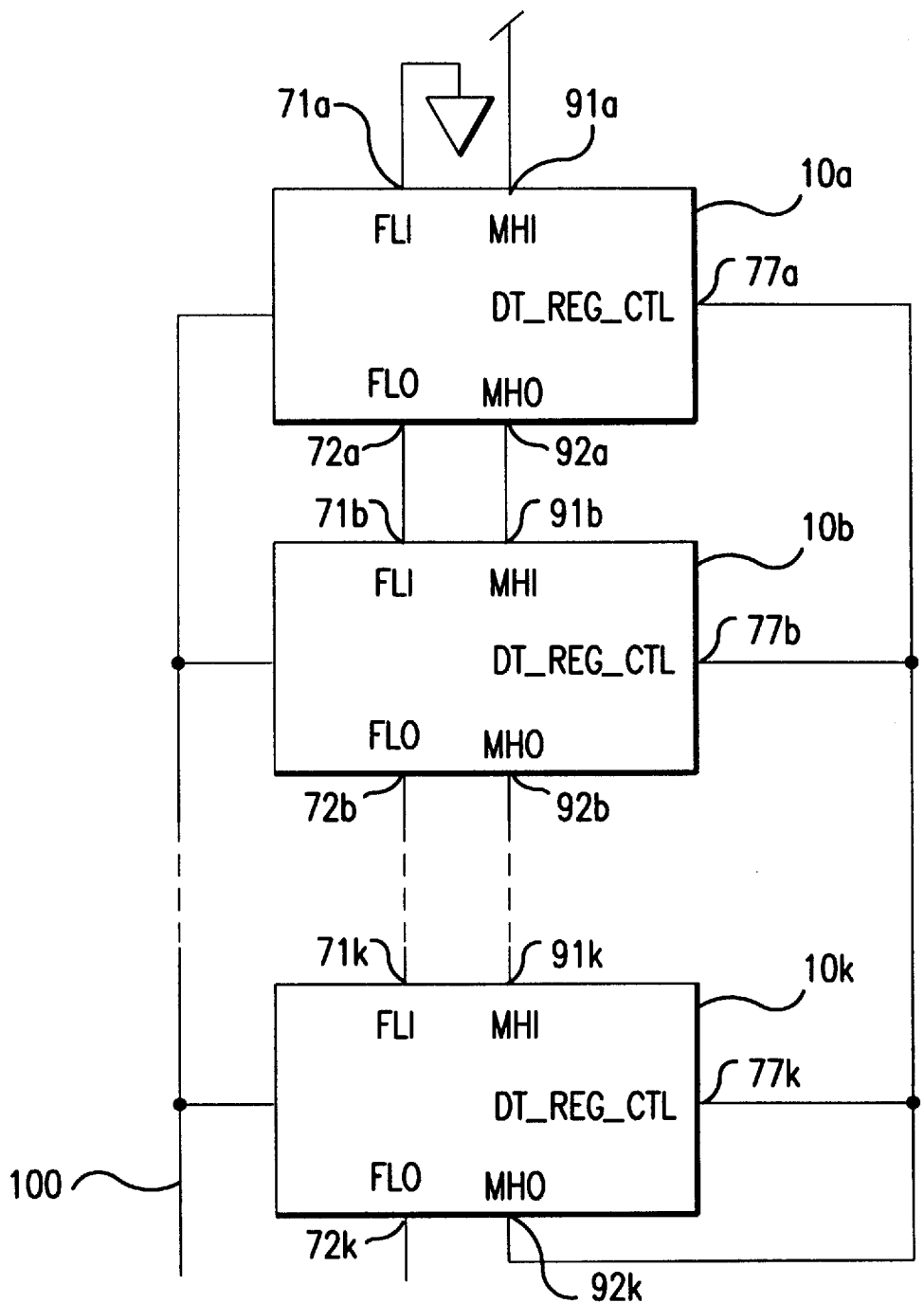
FIG. 8 is a schematic drawing of a plurality of associative memories connected in cascade.
Figure 9:
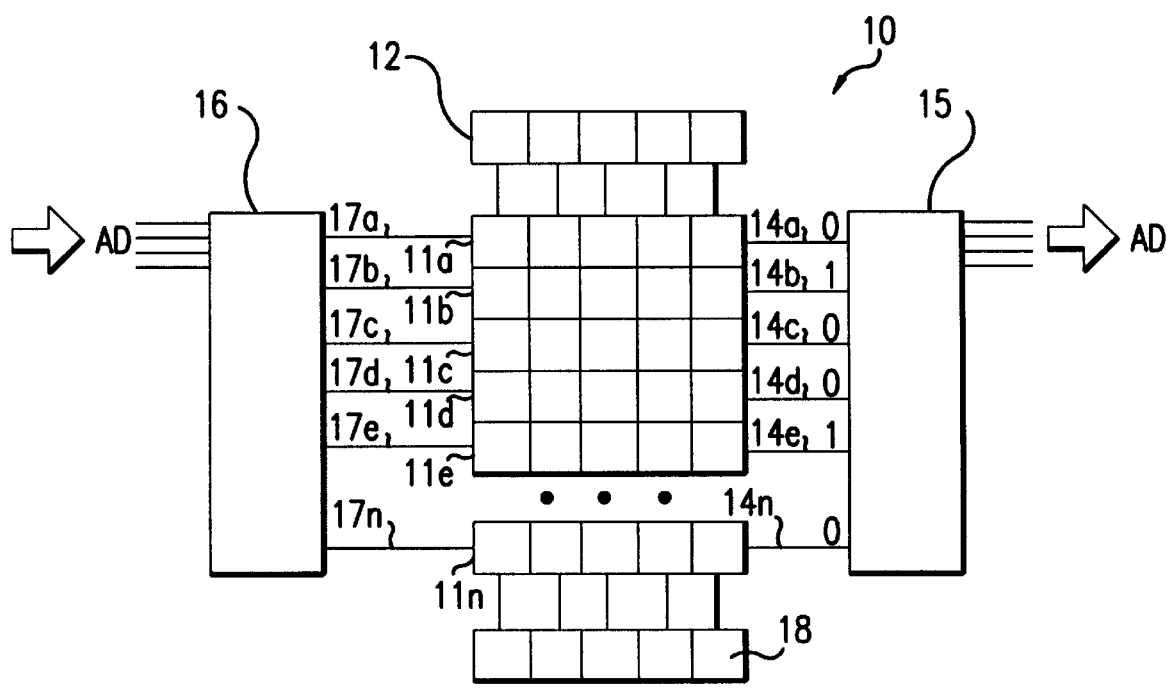
FIG. 9 is a circuit block diagram of a conventional associative memory.
Figure 10:
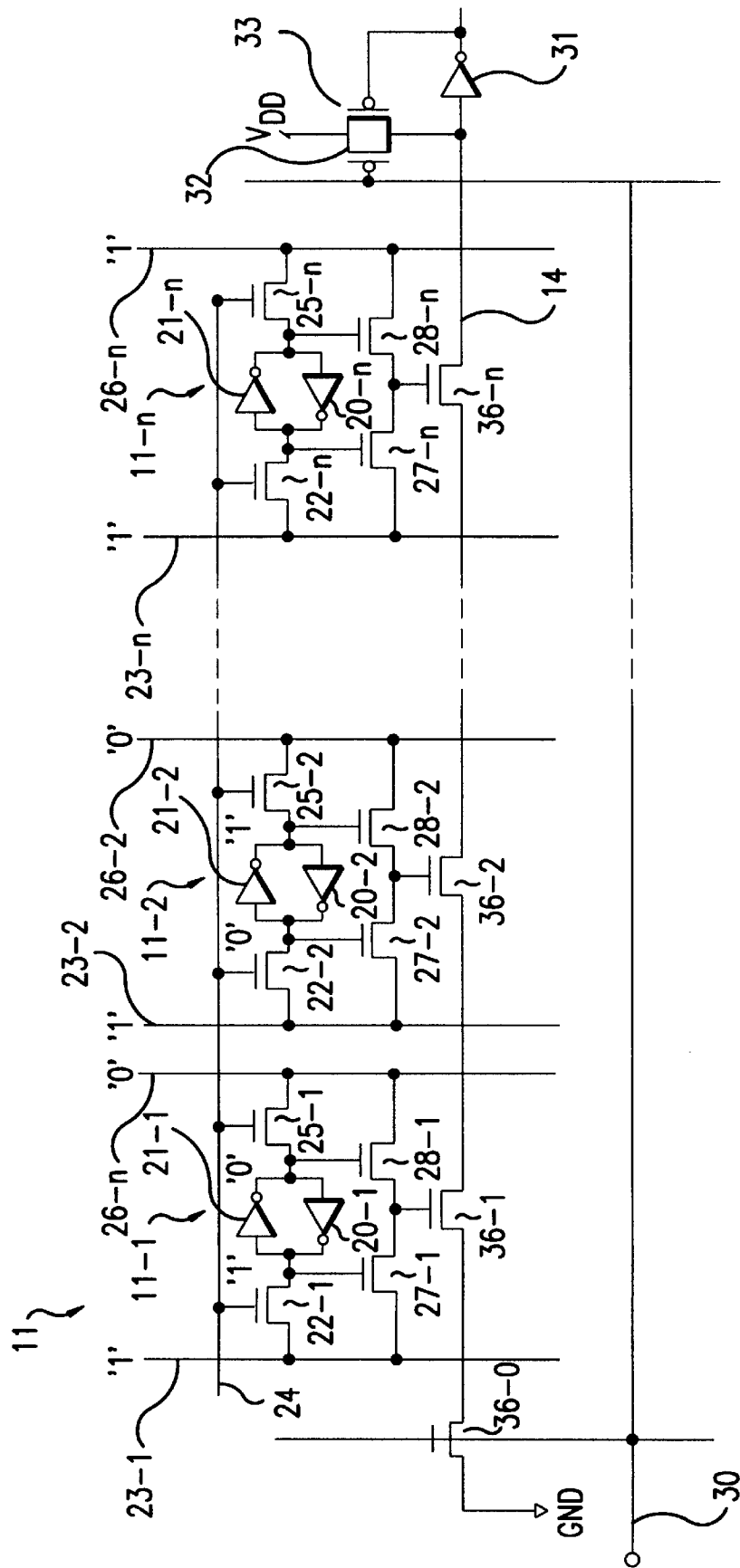
FIG. 10 is a detailed circuit diagram of one of the memory words in the conventional associative memory.
Figure 11A:
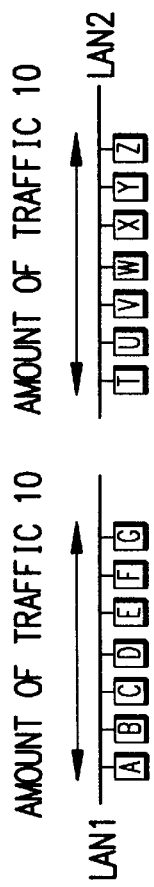
FIG. 11A, B and C is an example of a LAN.
Figure 11B:
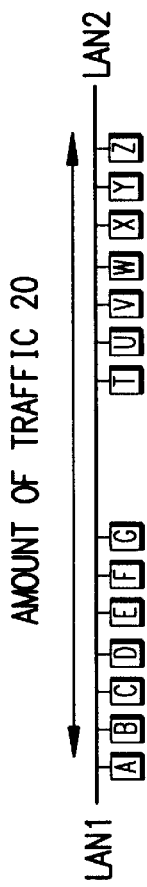
Figure 11C:
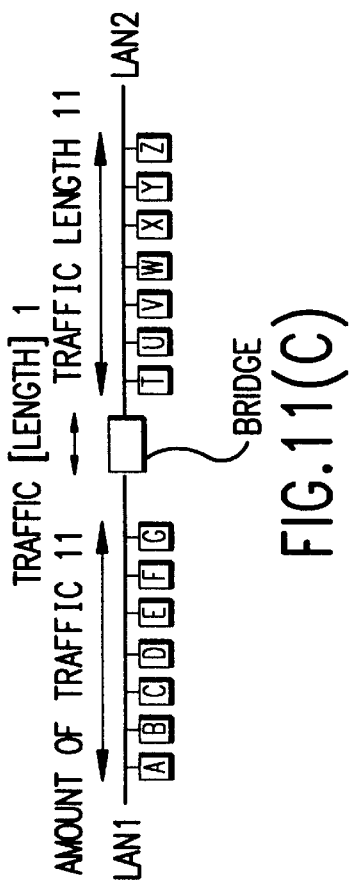
Figure 12:
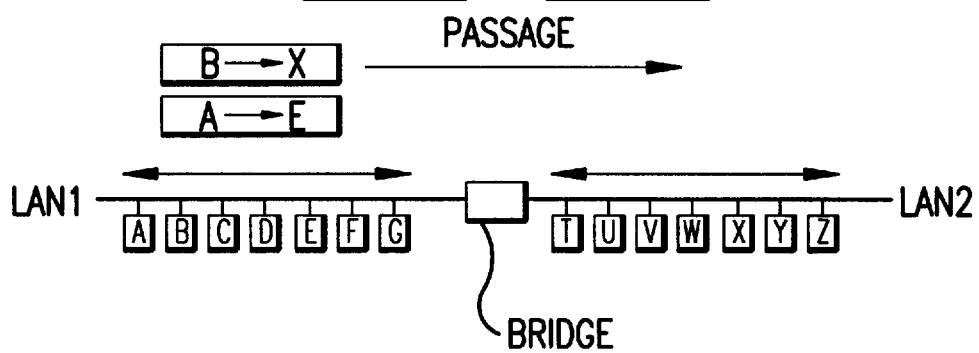
FIG. 12 is an explanatory drawing of a bridge function used for the LAN.

FIG. 8 is a schematic of the associative memory shown in FIG. 6 connected in cascade. Similar numerals identify similar elements in FIGS. 6–8 as for FIGS. 1–5. only differences between FIGS. 1–5 and 6–8 will be explained.

The embodiment shown in FIG. 6 includes a mishit signal input terminal 91 in which the first mishit signal MHI is input. MHI is active when at the "H" level. During retrieval, when a gate circuit 93 generates a second mishit signal MHO. Agreement is not detected in all of the associative memories connected to the front step side in view from a chip 10c, the second mishit signal MHO is at the "H" level. The second mishit signal MHO is output through terminal 92.

The associative memory 10c shown in FIG. 8 connected in cascade. In FIG. 8, the mishit signal output terminal 92a, 92b, . . . of the associative memory 10a, 10b, . . . of the front step side are connected similarly as the cascade connection shown in FIG. 1. The mishit signal input terminal 91b, . . ., 91k of the adjoining associative memory 10b, . . ., 10k is connected to the back step side. The mishit signal output terminal 92k of the associative memory 10k of the last step, is connected to the data registration control signal input terminal 77a, 77b, . . ., 77k of the all associative memories 10a, 10b, . . ., 10k. In addition, the mishit signal input terminal 91a of the associative memory 10a in the frontmost step, is pulled up to the "H" level so that the mishit signal MHI is the "H" level.

FIG. 7 is the timing chart for the associative memory 10c connected in cascade as shown in FIG. 8. The timing for when an agreement is detected during data writing and retrieval is the same as in FIG. 2. However, when agreement is not detected in all of the associative memories 10a, 10b, . . . , 10k, the second mishit signal MHO becomes the "H" level and output from the chip 10c. After delaying for the delaying time $T_3$, the mishit signal MHO output from the associative memory 10k in the final step is input to all chips connected in cascade as the data registration control signal DT-REG-CTL. When the data registration control signal DT-REG-CTL is input, the FLG-CTL signal of the chip 10c with the highest priority among the chips 10c being connected in cascade is activated. The retrieval data where agreement is not detected is automatically registered.

As explained above, according to the present invention, during retrieval, the data used for retrieval are registered to some of the memory words of the associative memory among the plurality of associative memories connected in cascade. Therefore, the retrieval and the writing can be carried out simultaneously and the process can be carried out at a higher speed.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. An associative memory integrated circuit that receives control signals, a first priority signal and retrieval data from an external source, the associative memory integrated circuit, comprising:

a plurality of memory words; and a data registration device coupled to the plurality of memory words, the data registration device storing the retrieval data in one of the plurality of memory words in response to the control signals if the first priority signal is not received from the external source and if the one of the plurality of memory words is in an open state, wherein said data registration device comprises a plurality of open flag registers, each of the plurality of open flag registers storing a state of a corresponding one of the plurality of memory words, the state being of a registered state and the open state.

2. The associative memory integrated circuit of claim 1, wherein the data registration device further comprises:
a flat reset circuit coupled to the plurality of open flag registers, the flag reset circuit resetting the plurality of open flag registers in response to the control signals; and
a data registration state detection circuit coupled to the priority of open flag registers, the data registration state detection circuit generating an open signal when at least one of the plurality of open flag registers is in the open state.

3. The associative memory integrated circuit of claim 2, wherein the data registration device further comprises:
a priority signal input terminal coupled to the flag reset circuit, the flag reset circuit receiving the first priority signal from the external source through the priority signal input terminal; and
a priority signal output terminal coupled to the data registration state detection circuit, wherein the data registration device outputs a second priority signal through the priority signal output terminal when one of the first priority signal has been received by the flag reset circuit and the open signal is generated by the data state registration detection circuit.

4. The associative memory integrated circuit of claim 2, wherein the data registration device further comprises;
a retrieval data writing circuit coupled to the plurality of memory words, the retrieval data writing circuit storing the retrieval data into the one of the plurality of memory words.

5. The associative memory integrated circuit of claim 2, wherein the control signals include a data registration control signal and the data registration device further comprises:
a data registration control signal input terminal coupled to the flag reset circuit, wherein if the data registration state detection circuit generates the open signal and the first priority signal is not received from the external source through the priority signal input terminal, then the flag reset circuit resets the open flag register corresponding to the one of the plurality of memory words in response to the data registration control signal being received from the external source through the data registration control signal input terminal.

6. The associative memory integrated circuit of claim 2, wherein the data registration device further comprises:
a mishit signal input terminal; and
a mishit signal output terminal coupled to the mishit signal input terminal, the data registration device outputting a second mishit signal through the mishit signal output terminal when a first mishit signal is received from the external source through the mishit signal input terminal and the retrieval data is not stored in the plurality of memory words of the associative memory integrated circuit.

7. The associative memory integrated circuit of claim 2, wherein the data registration device further comprises:
a registration flag register coupled to the flag reset circuit, the flag reset circuit resetting the open flag register corresponding to the one of the plurality of memory words storing the retrieval data when the registration flag register is set to ON.

8. An associative memory that includes a plurality of associative memory integrated circuits, each of the plurality of associative memory integrated circuits receiving control signals and retrieval data from an external source, each of the plurality of associative memory integrated circuits, comprising:
a plurality of memory words; and
a data registration device coupled to the plurality of memory words, the data registration device storing the retrieval data in one of the plurality of memory words in response to the control signals if a first priority signal is not received from another one of the plurality of associative memory integrated circuits and if the one of the plurality of memory words is in an open state, wherein said data registration device comprises a plurality of open flag registers, each of the plurality of open flag registers storing a state of a corresponding one of the plurality of memory words, the state being one of a registered state and the open state.

9. The associative memory of claim 8, wherein the data registration device further comprises:
a flag reset circuit coupled to the plurality of open flag registers, the flag reset circuit resetting the plurality of open flag registers in response to the control signals; and
a data registration state detection circuit coupled to the plurality of open flag registers, the data registration state detection circuit generating an open signal when at least one of the plurality of open flag registers is in the open state.

10. The associative memory of claim 9, wherein the data registration device further comprises:
a priority signal input terminal coupled to the flag reset circuit, the flag reset circuit receiving the first priority signal from another one of the plurality of associative memory integrated circuits through the priority signal input terminal; and
a priority signal output terminal coupled to the data registration state detection circuit, wherein the data registration device outputs a second priority signal through the priority signal output terminal when one of the first priority signal has been received by the flag reset circuit and the open signal is generated by the data state registration detection circuit.

11. The associative memory of claim 10, wherein the priority signal output terminal of each of the plurality of associative memory integrated circuits is connected to a priority signal input terminal of a following one of the plurality of associative memory integrated circuits forming a cascade of the plurality of associative memory integrated circuits, the priority signal input terminal of a first one of the plurality of associative memory integrated circuits being connected to a preset signal, each of the plurality of associative memory integrated circuits having a higher priority than the following one of the plurality of associative memory circuits, the first one of the plurality of associative memory integrated circuits having a highest priority and a last one of the plurality of associative memory integrated circuits having a lowest priority.

12. The associative memory of claim 11, wherein the first priority signal is received by one of the plurality of associative memory integrated circuits when the open signal is generated by a data registration state detection circuit of another one of the plurality of associative memory integrated circuits that has a priority higher than the priority of the one of the plurality of associative memory integrated circuits.

13. The associative memory of claim 9, wherein the data registration device further comprises:

a retrieval data writing circuit coupled to the plurality of memory words, the retrieval data writing circuit storing the retrieval data into one of the plurality of memory words.

14. The associative memory of claim 9, wherein the control signals include a data registration control signal and the data registration device further comprises:

a data registration control signal input terminal coupled to the flag reset circuit, wherein if the data registration state detection circuit generates the open signal and the first priority signal is not received from another one of the plurality of associative memory integrated circuits through the priority signal input terminal, then the flag reset circuit resets the open flag register corresponding to the one of the plurality of memory words in response to the data registration control signal being received through the data registration control signal input terminal.

15. The associative memory of claim 9, wherein the data registration device further comprises:

a mishit signal input terminal; and a mishit signal output terminal coupled to the mishit signal input terminal, the data registration device outputting a second mishit signal when a first mishit is received from another one of the plurality of associative memory integrated circuits through the mishit signal input terminal and the retrieval data is not stored in the plurality of memory words of the each one of the plurality of associative memory integrated circuits.

16. The associative memory of claim 15, wherein the mishit signal output terminal of each of the plurality of associative memory integrated circuits is connected to a mishit signal input terminal of a following one of the plurality of associative memory integrated circuits forming a cascade of the plurality of associative memory integrated circuits, the mishit signal input terminal of a first one of the plurality of associative memory integrated circuits being connected to a preset signal, each of the plurality of associative memory integrated circuits having a higher priority than the following one of the plurality of associative memory circuits, the first one of the plurality of associative memory integrated circuits having a highest priority and a last one of the plurality of associative memory integrated circuits having a lowest priority.

17. The associative memory of claim 16, wherein the mishit signal is received by one of the plurality of associative memory integrated circuits when the retrieval data is not stored in the plurality of memory words of another one of the plurality of associative memory integrated circuits having a priority higher than a priority of the one of the plurality of associative memory integrated circuits.

18. The associative memory of claim 9, wherein the data registration device further comprises:

a registration flag register coupled to the flag reset circuit, the flag reset circuit resetting the open flag register corresponding to the one of the plurality of memory words storing retrieval data when the registration flag register is set to ON.

\* \* \* \* \*